United States Patent [19]
Keller

[11] Patent Number: 5,492,597
[45] Date of Patent: Feb. 20, 1996

[54] METHOD OF ETCHING $WSI_x$ FILMS

[75] Inventor: David J. Keller, Boise, Id.

[73] Assignee: Micron Semiconductor, Inc., Boise, Id.

[21] Appl. No.: 242,230

[22] Filed: May 13, 1994

[51] Int. Cl.$^6$ .................................................. H01L 21/00
[52] U.S. Cl. ..................... 156/643.1; 156/656.1; 156/657.1; 156/659.11; 216/67; 252/79.1; 437/200
[58] Field of Search ............................. 156/643.1, 652.1, 156/656.1, 657.1, 659.11, 662.1; 252/79.1; 204/192.32, 192.35, 192.37; 437/192, 193, 200, 233, 245; 216/67

[56]         References Cited
            U.S. PATENT DOCUMENTS 5,382,316  1/1995  Hill et al. ........................ 156/657 X
5,387,312  2/1995  Keller et al. ........................ 156/643

Primary Examiner—William Powell
Attorney, Agent, or Firm—David J. Paul

[57]                 ABSTRACT

The present invention teaches a method for etching a tungsten silicide ($WSi_x$) film overlying a polysilicon film in an enclosed chamber during a semiconductor fabrication process, by the steps of: providing a patterned mask overlying the $WSi_x$ film thereby providing exposed portions of the $WSi_x$ film; presenting an etchant chemistry comprising $NF_3$ and $HeO_2$ to the exposed portions of the $WSi_x$ film at a temperature ranging from $-20°$ C. to $100°$ C., thereby etching away the exposed portions of the $WSi_x$ film and simultaneously etching substantially vertical sidewalls in the $WSi_x$ film, the etching continues into the polysilicon film, thereby forming a $WSi_x$/polysilicon stack having substantially vertical sidewalls.

20 Claims, 1 Drawing Sheet

METHOD OF ETCHING WSI$_x$ FILMS

FIELD OF THE INVENTION

This invention relates generally to semiconductor fabrication and in particular to a method for etching WSi$_x$ films.

BACKGROUND OF THE INVENTION

Semiconductor fabrication, tungsten silicide (WSi$_x$) has developed as a leading conductive layer to be formed on a polysilicon layer for improved conductivity. Various etching chemistries have been developed to pattern the Wsi$_x$/polysilicon stack to form such conductors as the digitline or wordline used in memory devices.

Memory devices have become very densely packed as the storage capability of each device has increased. In that light, it becomes important to etch substantially vertical lines within minimum feature widths. The majority of etching in tight spaces is accomplished by accelerating ions across a cathode sheath which are highly directional and thus make it to the bottom of tight spaces much easier than neutrals that move in all directions. However, the typical etching chemistry, like SF$_6$, CF$_4$, CHF$_3$ or C$_2$F$_6$, will lose etching momentum in tight areas relative to open areas due to the deposition of sulfur or carbon in the tight areas relative to open areas. This phenomenon is known as micro-loading and is undesirable.

There are several possibilities which may cause micro-loading. One possible cause of micro-loading may be deposition due to the lack of sufficient neutrals in the tight areas to recombine with the deposited material to form volatile species that can be removed from the chamber. Another possibility may be due to ions reflecting off of the photoresist side walls that may cause more deposition matter buildup in tight areas than in open areas. Regardless of the cause for micro-loading, an etching chemistry for etching WSi$_x$ is needed that will minimize, if not eliminate micro-loading effects. The present invention addresses this very issue by teaching a new WSi$_x$ etching chemistry that does minimizes micro-loading.

SUMMARY OF THE INVENTION

The present invention teaches a method for etching a tungsten silicide (WSi$_x$) film in an enclosed chamber during a semiconductor fabrication process, the method comprising the steps of:

providing a patterned mask overlying the WSi$_x$ film thereby providing exposed portions of the WSi$_x$ film;

presenting an etchant chemistry comprising NF$_3$ and HeO$_2$ to the exposed portions of the WSi$_x$ film at a temperature ranging from $-20°$ C. to $100°$ C., thereby etching away the exposed portions of the WSi$_x$ film and simultaneously etching substantially vertical sidewalls in the WSi$_x$ film.

DETAILED DESCRIPTION OF THE INVENTION

Figure 1:
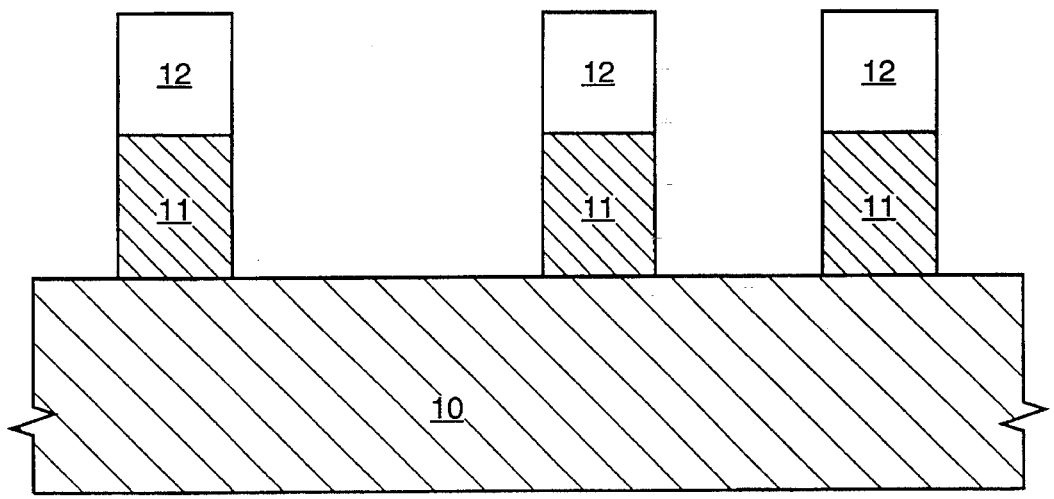
FIG. 1 is a composite cross-sectional view of a process wafer portion depicting the etching activity of the etch chemistry of the present invention on a WSi$_x$ film patterned with open areas and tight areas to be removed.
Figure 2:
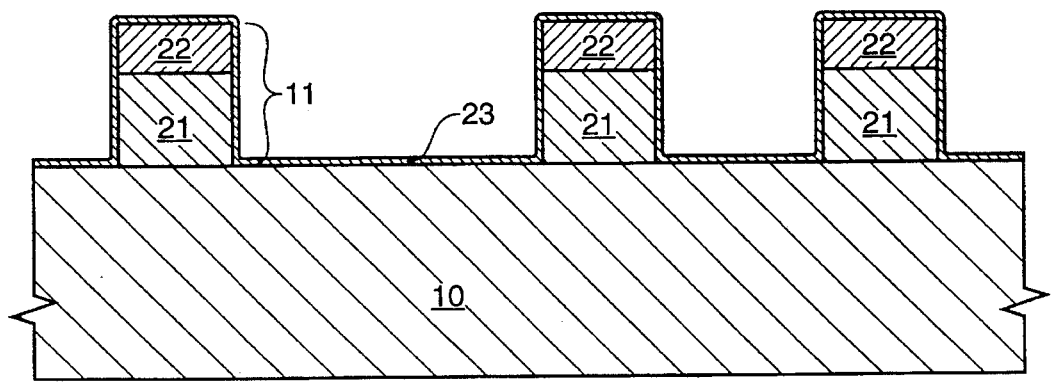
FIG. 2 is a composite cross-sectional view of a process wafer portion depicting an alternate embodiment of the present invention.

The present invention, as depicted in FIGS. 1 and 2 demonstrates process steps integrated into a fabrication process of semiconductor device, such as for a dynamic random access memory (DRAM) or a static random access memory (SRAM). Though, the process described hereinafter, may be taken as reference to DRAM or SRAM fabrication, it is meant to serve as an example for practicing the present invention. As one skilled in the art will recognize from the detailed description that follows, the present invention may be integrated into any semiconductor fabrication process that requires the pattern and etching of conductive lines using WSi$_x$ films.

Referring now to FIG. 1, a supporting substrate 10 (a silicon substrate for example) has a film 11 comprising WSi$_x$ formed thereover and is placed inside an enclosed etchant chamber. A patterned mask 12 overlies film 11 to provide exposed portions thereof. An etchant chemistry comprising NF$_3$ and HeO$_2$ is then presented to the exposed portions of the film 11 at a temperature ranging from $-20°$ C. to $100°$ C. This etchant chemistry proceeds to etch away the exposed portions of film 11 while simultaneously etching substantially vertical sidewalls in film 11. The substantially vertical sidewalls result from the formation of an NF$_3$ plasma that creates positive ions comprising fluorine (F) and nitrogen (N) in the form of F, N and NF$_x$ that travel perpendicular to a self biased cathode of the enclosed chamber. (As a side note, this etching chemistry reduces micro-loading because all the species produced by NF$_3$ and HeO$_2$ chemistries are gases at room temperature which are volatile. Therefore, they will not build up in tight areas. Conversely, typical chemistries such as SF$_6$, CF$_4$, CHF$_3$ or C$_2$F$_6$ will produce carbon and sulfur which are solids at room temperature. These solids are non-volatile and will build up in tight areas and thus cause micro-loading.)

In an alternate embodiment and referring now to FIG. 2, film 11 is comprised of a WSi$_x$ film 22 overlying a polysilicon layer (or film) 21 to form a WSi$_x$/polysilicon stack 22/21. When film 11 comprises polysilicon layer 22 lying underneath WSi$_x$ film 22, the polysilicon layer is then etched with the same etchant chemistry comprising NF$_3$ and HeO$_2$. In this case, the exposed portions of the WSi$_x$ film 22 are etched to form substantially vertical sidewalls in the WSi$_x$ film, and the etching continues into the polysilicon film, thereby forming a WSi$_x$/polysilicon stack having substantially vertical sidewalls. The removal of the Wsi$_x$/polysilicon stack (or the WSi$_x$ as the case may be) is enhanced when a chlorine containing compound, an iodine containing compound or a bromine containing compound is added to the etchant chemistry etchant chemistry comprising NF$_3$ and HeO$_2$. A major reason for the etching enhancement is that when these higher order halogens (Cl, Br and I) combine with Si, passivation forms because of the low volatility of SiCl$_4$, SiBr$_4$, and SiI$_4$, relative to SiF$_4$. In turn this passivation will prevent the WSi$_x$ and the poly (which may be highly doped) from undercutting.

Also, depending on the desired use of the polysilicon film 21, this film may be doped as p-type by using a dopant concentration of boron or doped as n-type by using either a dopant concentration of phosphorus or arsenic.

Next, a dielectric film 23 is formed over WSi$_x$ film 22. This dielectric film may be a dielectric film such as silicon nitride or silicon dioxide.

The method may be integrated into a memory device fabrication process wherein the WSi$_x$/polysilicon stack 22/21 forms a wordline or a digitline (such as in a DRAM or SRAM). This method may also be effectively integrated into a logic device fabrication process or even a microprocessor device fabrication process where a $WSi_x$/polysilicon stack or simply a patterned $WSi_x$ structure will be utilized.

It is to be understood that although the present invention has been described in a preferred embodiment, various modifications known to those skilled in the art may be made without departing from the invention as recited in the several claims appended hereto.

What is claimed is:

1. A method for etching a tungsten silicide ($WSi_x$) film in an enclosed chamber during a semiconductor fabrication process, said method comprising the steps of:
   providing a patterned mask overlying said $WSi_x$ film thereby providing exposed portions of said $WSi_x$ film;
   presenting an etchant chemistry comprising $NF_3$ and $HeO_2$ to said exposed portions of the $WSi_x$ film at a temperature ranging from $-20°$ C. to $100°$ C., thereby etching away said exposed portions of said $WSi_x$ film and simultaneously etching substantially vertical sidewalls in said $WSi_x$ film.

2. The method as recited in claim 1, wherein said presentation of said etchant chemistry forms an NF3 plasma thereby creating positive ions comprising fluorine (F) and nitrogen (N) in the form of F, N and $NF_x$ that travel perpendicular to a self biased cathode of said enclosed chamber, thereby resulting in said substantially vertical sidewalls.

3. The method as recited in claim 1, further comprising a polysilicon layer lying underneath said $WSi_x$ film, said polysilicon layer is etched with the same etchant chemistry comprising $NF_3$ and $HeO_2$.

4. A method for etching a tungsten silicide ($WSi_x$) film overlying a polysilicon film in an enclosed chamber during a semiconductor fabrication process, said method comprising the steps of:
   providing a patterned mask overlying said $WSi_x$ film thereby providing exposed portions of said $WSi_x$ film;
   presenting an etchant chemistry comprising $NF_3$ and $HeO_2$ to said exposed portions of the $WSi_x$ film at a temperature ranging from $-20°$ C. to $100°$ C., thereby etching away said exposed portions of said $WSi_x$ film and simultaneously etching substantially vertical sidewalls in said $WSi_x$ film, said etching continues into said polysilicon film, thereby forming a $WSi_x$/polysilicon stack having substantially vertical sidewalls.

5. The method as recited in claim 4, further comprising the deposition of a dielectric film over said $WSi_x$ film.

6. The method as recited in claim 5, wherein said dielectric film is silicon nitride.

7. The method as recited in claim 5, wherein said dielectric film is silicon dioxide.

8. The method as recited in claim 4, wherein said polysilicon film contains a dopant concentration comprising a dopant selected from the group consisting of phosphorus, arsenic and boron.

9. The method as recited in claim 8, wherein a chlorine containing compound is added to said etchant chemistry.

10. The method as recited in claim 8, wherein a bromine containing compound is added to said etchant chemistry.

11. The method as recited in claim 8, wherein an iodine containing compound is added to said etchant chemistry.

12. The method as recited in claim 4, wherein said presentation of said etchant chemistry forms an $NF_3$ plasma thereby creating positive ions comprising fluorine (F) and nitrogen (N) in the form of N, F and $NF_x$ that travel perpendicular to a self biased cathode of said enclosed chamber, thereby resulting in said substantially vertical sidewalls.

13. The method as recited in claim 4, wherein said $WSi_x$/polysilicon stack forms a wordline.

14. The method as recited in claim 4, wherein said $WSi_x$/polysilicon stack forms a digitline.

15. The method as recited in claim 4, wherein said semiconductor fabrication process is a logic device fabrication process.

16. The method as recited in claim 4, wherein said semiconductor fabrication process is a microprocessor device fabrication process.

17. The method as recited in claim 4, wherein said semiconductor/fabrication process is a memory device fabrication process.

18. The method as recited in claim 17, wherein said memory device fabrication process is a dynamic random access memory (DRAM) device fabrication process.

19. The method as recited in claim 17, wherein said memory device fabrication process is a static random access memory (SRAM) device fabrication process.

20. The method as recited in claim 17, wherein said memory device fabrication process is a flash memory device fabrication process.

* * * * *